(12) United States Patent
Delpech et al.

(10) Patent No.: US 7,033,887 B2
(45) Date of Patent: Apr. 25, 2006

(54) PROCESS FOR PRODUCING AN INTEGRATED ELECTRONIC CIRCUIT THAT INCLUDES A CAPACITOR

(75) Inventors: Philippe Delpech, Meylan (FR); Christophe Regnier, St. Hilaire du Touvet (FR); Sebastien Cremer, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/850,042

(22) Filed: May 20, 2004

(65) Prior Publication Data

US 2005/0032303 A1    Feb. 10, 2005

(30) Foreign Application Priority Data

May 20, 2003   (FR) .................................. 03 06031

(51) Int. Cl.
*H01L 21/8242* (2006.01)
(52) U.S. Cl. ...................... 438/250; 438/393
(58) Field of Classification Search ........ 438/250–256, 438/393–399
See application file for complete search history.

(56) References Cited

U.S. PATENT DOCUMENTS

| | | | |
|---|---|---|---|
| 5,049,957 A | 9/1991 | Inoue et al. | |
| 5,155,657 A * | 10/1992 | Oehrlein et al. | 361/313 |
| 5,196,365 A * | 3/1993 | Gotou | 438/254 |
| 5,479,316 A | 12/1995 | Smrtic et al. | |
| 5,985,731 A * | 11/1999 | Weng et al. | 438/396 |
| 6,037,212 A * | 3/2000 | Chao | 438/253 |
| 6,204,119 B1 * | 3/2001 | Lange et al. | 438/254 |
| 6,551,399 B1 | 4/2003 | Sneh et al. | |

OTHER PUBLICATIONS

French Preliminary Search Report dated Apr. 16, 2004 for French Appl. No. 03 06031.

* cited by examiner

*Primary Examiner*—Jennifer Kennedy
(74) *Attorney, Agent, or Firm*—Lisa K. Jorgenson; Jon A. Gibbons; Fleit, Kain, Gibbons, Gutman, Bongini & Bianco, P.L.

(57) ABSTRACT

A process for producing an integrated electronic circuit that includes a capacitor comprises the formation of a stack on top of a substrate (100, 101). The stack comprises a first volume of a temporary material, a second volume (2) of at least one insulating dielectric and a third volume (3) of a first electrically conducting material. After a coating material (4) has been deposited on the stack, the temporary material is removed via access shafts (C1, C2) that are formed between a surface (S) of the circuit and the first volume. The temporary material is then replaced with a second, electrically conducting material.

20 Claims, 1 Drawing Sheet

ABSTRACT

PROCESS FOR PRODUCING AN INTEGRATED ELECTRONIC CIRCUIT THAT INCLUDES A CAPACITOR

CROSS-REFERENCE TO RELATED APPLICATIONS

This application is based upon and claims priority from prior French Patent Application No. 03 06031, filed on May 20, 2003 the entire disclosure of which is herein incorporated by reference.

1. Field of the Invention

The present invention generally relates to a process for producing an integrated electronic circuit and more specifically to a process for producing an integrated electronic circuit that includes a capacitor.

2. Background of the Invention

Integrated electronic circuits currently produced may include, in a known manner, one or more capacitors formed during integration of the circuit. Such capacitors are produced by successive deposition of materials on the substrate of the circuit. They are generally placed within layers of insulating materials that cover the substrate and which include, moreover, electrical connections that connect components of the circuit.

Although production of integrated capacitors is useful, it is not without its shortcomings and problems, especially when trying to reduce the size of the capacitor.

One particularly widely used integrated capacitor is a MIM (Metal Insulator Metal) capacitor. Such a capacitor is generally formed from two plane metal electrodes placed facing each other, parallel to the surface of the substrate and separated by at least one layer of an electrically insulating dielectric. Depending on the desired capacitance, the electrodes of a MIM capacitor may have a length of up to 140 microns, for example. Such a capacitor, therefore, occupies a large portion of the surface of the substrate of the circuit. It then corresponds to a significant part of the manufacturing cost of the electronic circuit, proportional to the area of substrate occupied.

It is therefore beneficial to reduce the dimensions of an integrated capacitor for the same capacitance. To do this, one known method is to reduce the thickness of the dielectric that separates the electrodes in the direction perpendicular to the electrodes.

However, reduction in the thickness of the dielectric is limited by the quality of the dielectric when this is made in the form of a layer of small thickness. This is because, below a thickness of about 30 nanometers, the dielectric layer generally has an irregular, rough and poorly controlled structure.

This is a particularly major limitation in the case of a MIM capacitor produced by deposition of a lower metal electrode on top of the substrate, followed by deposition of the dielectric layer on the lower electrode, then deposition of an upper metal electrode on the dielectric layer. This is because such formation of the dielectric on the metallic material of the lower electrode generally causes nucleation of the dielectric in discreet islands, called three-dimensional nucleation. The structure of the dielectric layer is then highly irregular.

Moreover, diffusion of the atoms of the dielectric into the metal of the lower electrode also frequently occurs during deposition of the dielectric. The electrical properties of the lower electrode are then impaired. Likewise, diffusion of the atoms of the lower metal electrode into the dielectric, during deposition of the dielectric, reduces the electrical insulation capacitance of the dielectric layer. These atomic diffusion processes are promoted by the heating of the circuit needed to deposit the dielectric.

Finally, an alloy may be formed by chemical reaction between the metal of the lower electrode and the dielectric, during deposition of the latter.

Each of the above-mentioned phenomena, including nucleation of the dielectric in discrete islands and the diffusion of the atoms of the dielectric into the metal and chemical reactions, each increase the risks of breakdown of the dielectric layer and reduce the reliability of the integrated circuit obtained.

Accordingly, a need exists to overcome the shortcomings and drawbacks with the size reduction of capacitors in integrated electronic circuits.

SUMMARY OF THE INVENTION

Briefly in accordance with the present invention, provided is a process for producing an integrated electronic circuit that includes a capacitor, the process comprising the following steps:

formation of a stack comprising:
a first volume of temporary material placed on a part of a substrate;
a second volume of at least one electrically insulating dielectric placed on the first volume, on the opposite side of the first volume from the substrate; and
a third volume of a first electrically conducting material placed above the second volume, on the opposite side of the second volume from the first volume, so as to form a first electrode of the capacitor;

deposition of an electrically insulating coating material on the circuit so as to cover the stack and at least part of the circuit away from said substrate part;

formation of at least one access shaft between a surface of the circuit and the first volume;

removal of at least part of the temporary material via the access shaft so as to hollow out at least one portion of the first volume; and introduction of a second conducting material via the access shaft in the hollowed-out portion of the first volume, so as to form a second electrode of the capacitor.

Thus, according to the present invention, the temporary material of the first volume, on which the second volume of dielectric is placed, may be selected independently of the second conducting material that constitutes a second electrode of the capacitor. In particular, the temporary material may be selected so as to favor a regular structure of the dielectric of the second volume, when the second volume has a small thickness in the direction of the stack. The capacitor obtained then has improved characteristics, such as its breakdown resistance or the leakage current between the electrodes of the capacitor. Moreover, the regular structure of the dielectric of the second volume may also allow the thickness of the second volume to be reduced. For the same capacitance of the capacitor, the dimensions of the electrodes parallel to the substrate are then smaller.

Furthermore, by virtue of the present invention, the second conducting material that replaces the temporary material in the first volume, may be a metallic material selected so as to have a high work function value, without this requirement being combined with that of a second conducting material capable of obtaining a regular structure of the second volume of dielectric. This is because the latter requirement devolves on the choice of temporary material and not on that of the second conducting material. The second conducting material is thereby easier to select.

BRIEF DESCRIPTION OF THE DRAWING

The subject matter, which is regarded as the present invention, is particularly pointed out and distinctly claimed in the claims at the conclusion of the specification. The foregoing and other features, and advantages of the present invention will be apparent from the following detailed description taken in conjunction with the accompanying drawing in which:

DESCRIPTION OF THE PREFERRED EMBODIMENTS

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

In these figures, for the sake of clarity, the dimensions of the various component parts shown have not been drawn to scale. These figures are sectional views of a substantially planar substrate on which a MIM-type capacitor is formed. The sectional views are considered in a plane perpendicular to the surface of the substrate. The substrate is placed in the lower part of each figure and D denotes a direction perpendicular to the surface of the substrate, directed upwards in the figures. In what follows, the terms "above", "under", "lower" and "upper" are used with reference to this orientation. Moreover, in all the figures, identical references correspond to identical elements.

In what follows, the elementary process steps for fabricating an integrated electronic circuit, known to those of average skill in the art, will not be described in detail. A description is directed to a succession of elementary steps that makes it possible to produce a capacitor according to the process of the present invention.

Figure 1:
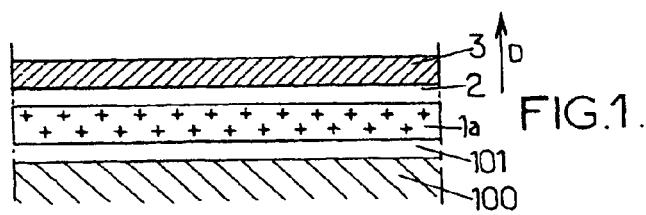
FIGS. 1 to 6 illustrate various steps in a process for fabricating a capacitor according to the present invention.

In FIG. 1, a substrate 100, for example, made of silicon, is covered with a layer 101 of insulating material, for example silica ($SiO_2$). Deposited in succession, on the layer 101, is then a layer 1a of temporary material, a layer 2 of insulating dielectric and a layer 3 of a first metallic material. The thicknesses, in the direction D, of the layers 1a, 2 and 3 are, for example, about 300 nanometers, 30 nanometers and 200 nanometers, respectively.

The dielectric is, for example, tantalum oxide ($Ta_2O_5$), hafnium oxide ($HfO_2$), titanium oxide ($TiO_2$), alumina ($Al_2O_3$) or any other insulating mixed oxide that combines metal atoms of several types. A dielectric of high dielectric permittivity is preferably used to increase the capacitance of the capacitor obtained. The first metallic material may be copper, aluminum, titanium nitride (TiN), tantalum nitride (TaN), tungsten or any metal, metallic compound or metal alloy compatible with the deposition process used.

The temporary material of the layer 1a is selected so as to be able to be selectively etched in the rest of the process.

The temporary material is also selected so as to obtain, during production of the layer 2, a regular and homogeneous structure of the layer 2 in directions parallel to the surface of the substrate 100. Such a regular structure generally results from a uniform nucleation of the material of the layer 2 on the temporary material.

The temporary material is also selected so as to be chemically inert vis-à-vis the dielectric and vis-à-vis the chemical species that are involved during its formation. It is also selected so as not to cause any atomic diffusion into the dielectric.

These requirements on the selection of the temporary material may be met more easily when the temporary material is not necessarily a metal or a metal alloy. The temporary material may, for example, be germanium or a silicon-germanium alloy. This may also, optionally, be a metallic material that meets these same requirements.

The layer 2 may be deposited by a chemical process of the CVD (Chemical Vapor Deposition) type. Conditions for depositing the dielectric are employed that are particularly suitable for obtaining a regular and uniform layer 2. In particular, a low deposition rate may be adopted and the deposition is preferably carried out with a low pressure in the deposition chamber used. In particular, a process for forming the dielectric by superposed successive atomic layers may be used.

Figure 2:
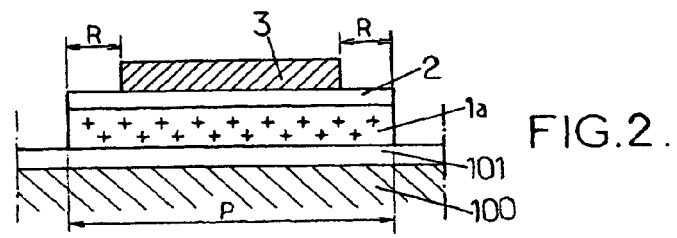

The layers 1a, 2 and 3 are then etched by combining one or more wet etching or dry etching processes with the use of lithographic masks. The structure shown in FIG. 2 is then obtained. This structure comprises volumes 1a, 2 and 3 corresponding to the above layers with same references, respectively. The volumes 1a, 2 and 3 are stacked in the direction D on top of a portion P of the substrate 100. For reasons that will appear below, the volume 1a is called the false lower electrode. The layer 3 may have an extent in a direction parallel to the surface S that is shorter than the extent of the layers 1a and 2 in the same direction. It then has at least one recess R, indeed two recesses R, located at the opposed ends of the layer 3. These recesses R correspond to exposed parts of the upper surface of the volume 2.

A coating material 4, which may for example be silica, is then deposited on the circuit. The material 4 covers the volumes 1a, 2 and 3 in the portion P of the substrate 100 and covers the substrate 100 outside the portion P. The upper surface S of the material 4 is polished so as to form a plane parallel to the surface of the substrate 100.

Two access shafts C1 and C2 parallel to the direction D are then formed from the surface S. The shafts C1 and C2 are formed at the recesses R so as not to come into contact with the volume 3. The cross section of the shafts C1 and C2 is defined by apertures in a lithographic mask (not shown).

Figure 3:
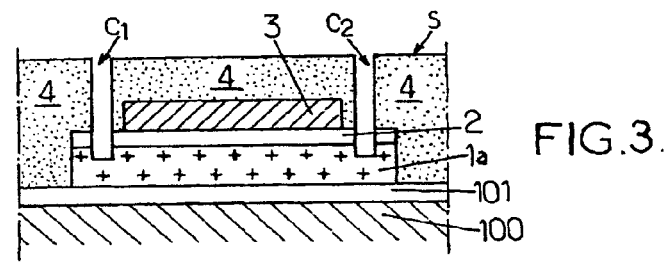

The shafts C1 and C2 are formed by dry anisotropic etching, using an etching plasma some of whose ions are directed against the surface S, in the direction D and in the opposite direction thereto, via the apertures in the mask. The configuration of the circuit illustrated by FIG. 3 is obtained.

Figure 4:
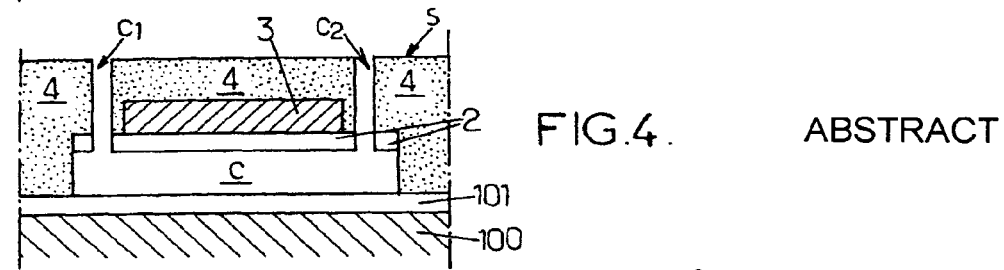

Next, a liquid solution for selectively etching the temporary material of the volume 1a is introduced via the shafts C1 and C2. If the temporary material is germanium or a silicon-germanium alloy, a solution that is both oxidizing and acidic may be used, which neither degrades the coating material 4 nor the dielectric of the volume 2, nor the material of the layer 101. The temporary material is then isotropically etched, removed by dissolving in the solution. A portion of the volume 1a is thus hollowed out so as to form a cavity C (FIG. 4).

Alternatively, the temporary material may be removed by dry, isotropic selective etching using a plasma that penetrates via the shafts C1 and C2 as far as the volume 1a.

The volumes 2 and 3 are kept a certain distance from the upper surface of the layer 101, these volumes being separated from the latter by the cavity C, and by the coating material 4. The material 4 bears on the upper surface of the layer 101, outside the portion P, and adheres to the volumes 2 and 3 so as to suspend the latter above the layer 101.

Figure 5:
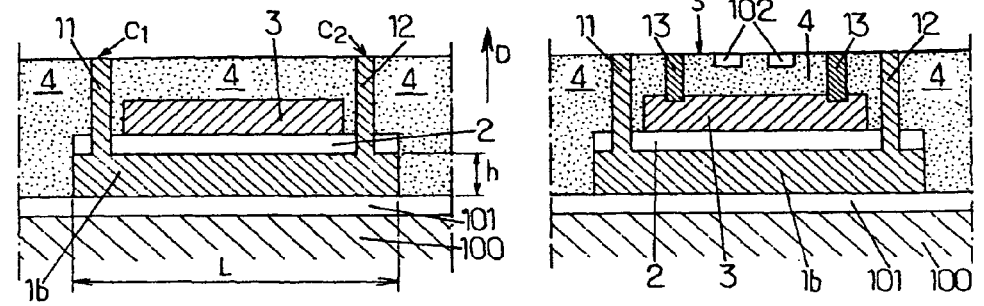

A second metallic material is then introduced, via the shafts C1 and C2, into the cavity C (FIG. 5). Preferably, the second metallic material is formed in the cavity C by CVD (Chemical Vapor Deposition). To do this, the circuit is heated. A gas containing volatile metal precursors, for example organometallics or chlorides, is then brought into contact with the surface S. The precursors penetrate into the shafts C1 and C2 and thermally decompose on contact with the walls of the cavity C, forming the metallic material. A filled volume 1b is thus obtained instead of the cavity C.

The second metallic material may, but not necessarily, be identical to the first metallic material. Alternatively, it may be selected from metal compounds that have a high work function value compared with the dielectric. In practice, work function values of greater than 5 electron volts are particularly desirable.

The second metallic material is simultaneously deposited in the cavity C and in the access shafts C1 and C2. The cross section of each shaft C1, C2 is determined so that each shaft C1, C2 is not closed before a sufficient amount of metallic material has been deposited in the cavity C. It is unnecessary for the cavity C to be entirely filled with metallic material but, after the step of introducing the second metallic material into the cavity C, at least that portion of the lower surface of the layer 2 located in the cavity must be covered with the second metallic material.

Such a covering is obtained, for a given cross section of the shafts C1 and C2, only if the two shafts are not too far apart. If the capacitor has a large dimension parallel to the surface of the substrate, it may then be necessary to provide additional access shafts, placed uniformly along this dimension. The inventors have found that, for access shafts having a circular cross section of approximately 150 nanometers in diameter, two neighboring shafts must not be separated by a distance exceeding 10 to 20 times the height h of the cavity C parallel to the direction D. Under these conditions, a continuous coating of the second metallic material is deposited that completely covers the walls of the cavity C. This maximum distance between the access shafts may be increased according to improvements in the deposition process used for the second metallic material.

If the lower electrode has small dimensions parallel to the surface of the substrate 100, a single access shaft suffices to hollow out the cavity C of the temporary material and then to fill it with the second metallic material.

Figure 6:
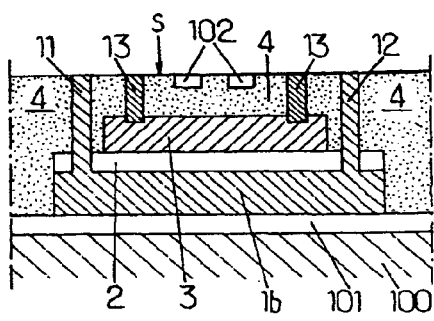

The upper surface of the circuit S is again polished, in order to remove the second metallic material deposited thereon. According to FIG. 6, electrical connections 13 parallel to the direction D are formed between the volume 3 and the surface S. The volume 3 then constitutes the upper electrode of the MIM capacitor. The volume 1b constitutes the lower electrode of the capacitor and the shafts C1 and C2 filled with the second metallic material constitute two electrical connections 11 and 12 placed between the lower electrode and the surface S. Thanks to the recesses R, the connections 11 and 12 are isolated from the upper electrode.

Production of the circuit then continues in a manner known to those of average skill in the art. In particular, integrated components 102 may be placed above the capacitor.

Many variants may be introduced into the process described above in detail. These variants form part of the present invention provided that the resulting process employs a false lower electrode, replaced thereafter by a definitive electrode made of conducting material. In particular, the volume of dielectric that separates the electrodes of the capacitor may be replaced with a volume layered in the direction D, filled with several layers of separate materials that are superposed or formed one on top of another. Likewise, the stack of the volumes 1a, 2 and 3 on the substrate 100, corresponding to FIG. 2, may be produced in many equivalent ways.

Another variant of the process described above consists in replacing the essentially planar configuration of the various volumes of the capacitor that are superposed in a direction perpendicular to the surface of the substrate with a configuration in which these various volumes are essentially parallel to one another, but may be of any shape. In particular, the capacitor may be formed in a cavity having an axis of symmetry, and the various volumes may be placed coaxially with respect to the axis of symmetry of the cavity.

Although a specific embodiment of the present invention has been disclosed, it will be understood by those having skill in the art that changes can be made to this specific embodiment without departing from the spirit and scope of the present invention. The scope of the present invention is not to be restricted, therefore, to the specific embodiment, and it is intended that the appended claims cover any and all such applications, modifications, and embodiments within the scope of the present invention.

What is claimed is:

1. A process for producing an integrated electronic circuit that includes a capacitor, the process comprising:
    formation of a stack comprising:
        a first volume of temporary material placed on a part of a substrate;
        a second volume of at least one electrically insulating dielectric placed on the first volume, so that the second volume of at least one electrically insulating dielectric directly contacts the first volume of temporary material on an opposite side of the first volume from the substrate, wherein the second volume of at least one electrically insulating dielectric forms a dielectric for a capacitor; and
        a third volume of a first electrically conducting material placed above the second volume, on an opposite side of the second volume from the first volume, so as to form a first electrode of the capacitor;
    deposition of an electrically insulating coating material so as to cover the stack and so as to cover at least part of the substrate not coated by the temporary material;
    formation of at least one access shaft from a top surface of the electrically insulating coating material down to the first volume, thus exposing the first volume;
    removal of at least part of the temporary material via the access shaft so as to hollow out at least one portion of the first volume, wherein the second volume of at least one electrically insulating dielectric forming the dielectric is placed on the first volume prior to the removal of at least part of the temporary material; and
    introduction of a second conducting material via the access shaft in the hollowed-out portion of the first volume, so as to form a second electrode of the capacitor.

2. The process according to claim 1, wherein during the introduction of the second conducting material includes introduction of the second conducting material deposited in both the hollowed-out portion of the first volume and in the access shaft.

3. The process according to claim 1, wherein the first and second conducting materials are metallic materials.

4. The process according to claim 1, wherein at least one of the first and second conducting materials are metallic materials with a high work function value as compared with the electrically insulating dielectric.

5. The process according to claim 4, wherein at least one of the first and second conducting materials are metallic materials where the high work function value is greater than 5 electron volts.

6. The process according to claim 4, wherein the introduction of a second conducting material is preformed using chemical vapor deposition.

7. The process according to claim 1, wherein the removal of at least part of the temporary material is preformed using at least one of wet isotropical etching and dry isotopical etching.

8. The process according to claim 1, wherein the formation of the stack with the first volume of temporary material includes temporary material which is chemically inert so not to cause any atomic diffusion into the electrically insulating dielectric.

9. The process according to claim 1, wherein the formation of the stack with the first volume of temporary material includes temporary material which during the formation of the second volume of at least one electrically insulating dielectric results from a uniform nucleation of the electrically insulating dielectric on the temporary material.

10. The process according to claim 1, furthermore comprising:
production of integrated components placed above the capacitor on an opposite side of the capacitor from the substrate.

11. A process for producing an integrated electronic circuit that includes a capacitor, the process comprising:
formation of a capacitor stack on a part of a substrate by forming layers of at least three volumes with a first volume of temporary material placed on a part of a substrate, a second volume of at least one electrically insulating dielectric for forming a dielectric of a capacitor placed above the first volume so that the second volume of at least one electrically insulating dielectric directly contacts the first volume of temporary material, and a third volume of a first electrically conducting material placed above the second volume so as to form a first electrode of a capacitor;
deposition of an electrically insulating coating material so as to cover the capacitor stack and so as to cover at least part of the substrate not coated by the temporary material;
formation of at least one access shaft from a top surface of the electrically insulating coating material down to the first volume, thus exposing the first volume;
removal of at least part of the temporary material via the access shaft so as to hollow out at least one portion of the first volume, wherein the second volume of at least one electrically insulating dielectric forming the dielectric is placed on the first volume prior to the removal of at least part of the temporary material; and
introduction of a second conducting material via the access shaft in the hollowed-out portion of the first volume, so as to form a second electrode of the capacitor.

12. The process according to claim 11, wherein during the introduction of the second conducting material includes introduction of the second conducting material deposited in both the hollowed-out portion of the first volume and in the access shaft.

13. The process according to claim 11, wherein the first and second conducting materials are metallic materials.

14. The process according to claim 11, wherein at least one of the first and second conducting materials are metallic materials with a high work function value as compared with the electrically insulating dielectric.

15. The process according to claim 14, wherein at least one of the first and second conducting materials are metallic materials where the high work function value is greater than 5 electron volts.

16. The process according to claim 14, wherein the introduction of a second conducting material is preformed using chemical vapor deposition.

17. The process according to claim 11, wherein the removal of at least part of the temporary material is preformed using at least one of wet isotropical etching and dry isotopical etching.

18. The process according to claim 11, wherein the formation of the stack with the first volume of temporary material includes temporary material which is chemically inert so not to cause any atomic diffusion into the electrically insulating dielectric.

19. The process according to claim 11, wherein the formation of the stack with the first volume of temporary material includes temporary material which during the formation of the second volume of at least one electrically insulating dielectric results from a uniform nucleation of the electrically insulating dielectric on the temporary material.

20. The process according to claim 11, furthermore comprising:
production of integrated components placed above the capacitor on an opposite side of the capacitor from the substrate.

* * * * *